US010084102B2

(12) United States Patent
Cai et al.

(10) Patent No.: US 10,084,102 B2
(45) Date of Patent: Sep. 25, 2018

(54) PLASMON-ENHANCED TERAHERTZ GRAPHENE-BASED PHOTODETECTOR AND METHOD OF FABRICATION

(71) Applicants: UNIVERSITY OF MARYLAND, COLLEGE PARK, College Park, MD (US); THE UNITED STATES OF AMERICA, AS REPRESENTED BY THE SECRETARY OF THE NAVY, Washington, DC (US); MONASH UNIVERSITY, Victoria (AU)

(72) Inventors: Xinghan Cai, College Park, MD (US); Andrei B. Sushkov, College Park, MD (US); Mohammad M. Jadidi, Laurel, MD (US); David Kurt Gaskill, Alexandria, VA (US); Thomas E. Murphy, Bethesda, MD (US); Michael Fuhrer, Victoria (AU); Howard Dennis Drew, Hyattsville, MD (US)

(73) Assignees: University of Maryland, College Park, College Park, MD (US); The United States of America, as represented by the Secretary of the Navy, Washington, DC (US); Monash University, Victoria (AU)

( * ) Notice: Subject to any disclaimer, the term of this patent is extended or adjusted under 35 U.S.C. 154(b) by 0 days.

(21) Appl. No.: 15/555,132

(22) PCT Filed: Mar. 1, 2016

(86) PCT No.: PCT/US2016/020213
§ 371 (c)(1),
(2) Date: Sep. 1, 2017

(87) PCT Pub. No.: WO2016/140946
PCT Pub. Date: Sep. 9, 2016

(65) Prior Publication Data
US 2018/0047856 A1 Feb. 15, 2018

Related U.S. Application Data

(60) Provisional application No. 62/126,939, filed on Mar. 2, 2015.

(51) Int. Cl.
*H01L 31/028* (2006.01)
*H01L 31/0352* (2006.01)
(Continued)

(52) U.S. Cl.
CPC ............ *H01L 31/028* (2013.01); *G02B 5/008* (2013.01); *G02B 5/3058* (2013.01);
(Continued)

(58) Field of Classification Search
CPC ...... H01L 31/028; G02B 5/008; G02B 5/3058
See application file for complete search history.

(56) References Cited

U.S. PATENT DOCUMENTS

2013/0193404 A1* 8/2013 Koppens ........... H01L 31/02327
257/9
2015/0263098 A1* 9/2015 Sajjad ................. H01L 29/1606
257/27

* cited by examiner

*Primary Examiner* — Hugh H Maupin
(74) *Attorney, Agent, or Firm* — Rosenberg, Klein & Lee

(57) ABSTRACT

A plasmon-enhanced terahertz graphene-based photodetector exhibits an increased absorption efficiency attained by utilizing a tunable plasmonic resonance in sub-wavelengths graphene micro-ribbons formed on SiC substrate in contact with an array of bi-metallic electrode lines. The orientation of the graphene micro-ribbons is tailored with respect to the array of sub-wavelengths bi-metallic electrode lines. The graphene micro-ribbons extend at the angle of approximately 45 degrees with respect to the electrode lines in the bi-metal electrodes array. The plasmonic mode is efficiently (Continued)

excited by an incident wave polarized perpendicular to the electrode lines, and/or to the graphene micro-ribbons. The absorption of radiation by graphene is enhanced through tunable geometric parameters (such as, for example, the width of the graphene micro-ribbons) and control of a carrier density in graphene achieved through tuning the gate voltage applied to the photodetector.

20 Claims, 12 Drawing Sheets

(51) Int. Cl.
  *H01L 31/0224*   (2006.01)
  *H01L 31/0232*   (2014.01)
  *H01L 31/103*   (2006.01)
  *G02B 5/30*   (2006.01)
  *G02B 5/00*   (2006.01)
  *H01L 31/18*   (2006.01)
  *H01S 4/00*   (2006.01)
  *H01L 29/16*   (2006.01)

(52) U.S. Cl.
  CPC ............... *H01L 31/02327* (2013.01); *H01L 31/022408* (2013.01); *H01L 31/035281* (2013.01); *H01L 31/103* (2013.01); *H01L 31/1804* (2013.01); *H01L 29/1606* (2013.01); *H01S 4/00* (2013.01)

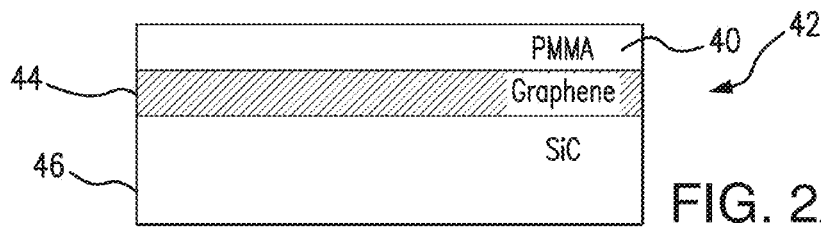
FIG. 2A
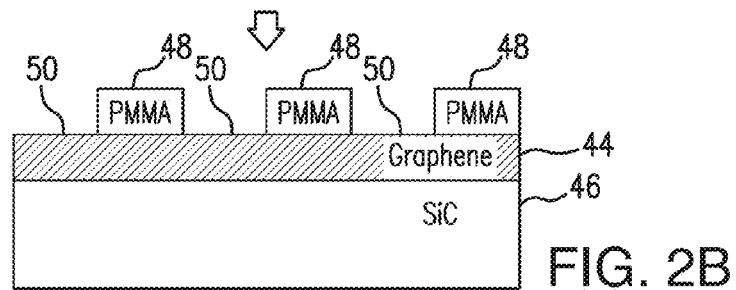
FIG. 2B
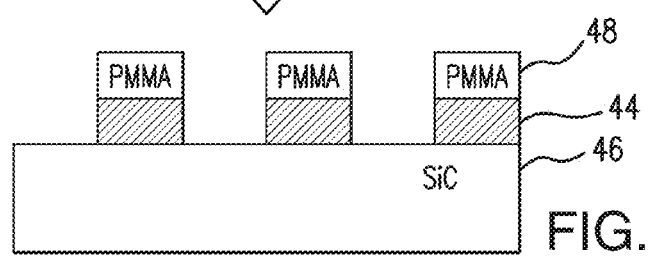
FIG. 2C
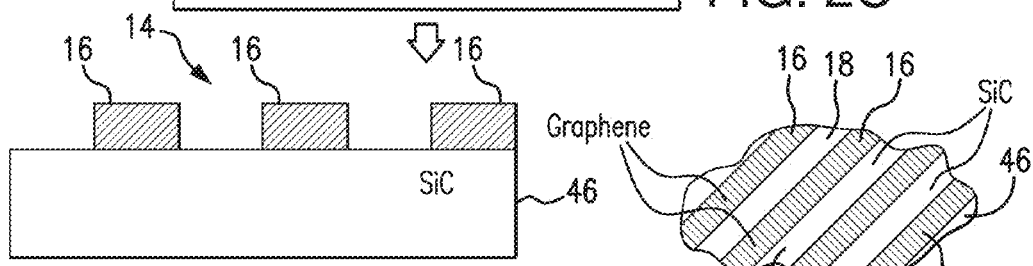
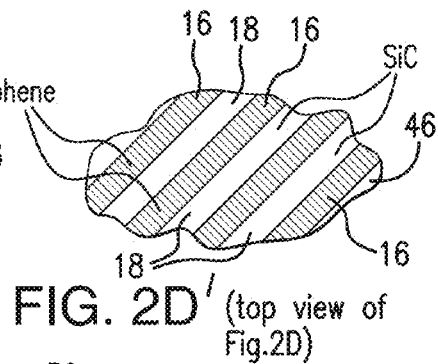
FIG. 2D
FIG. 2D' (top view of Fig. 2D)
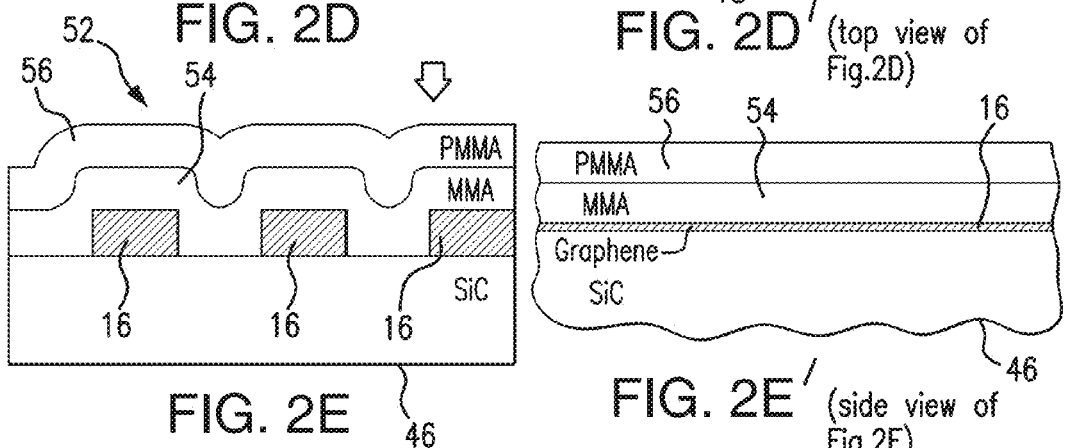
FIG. 2E
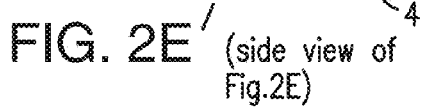
FIG. 2E' (side view of Fig. 2E)

FIG. 2I' (top view of Fig. 2I)

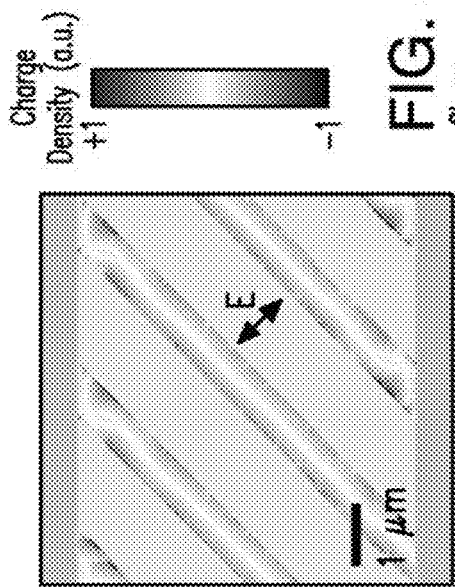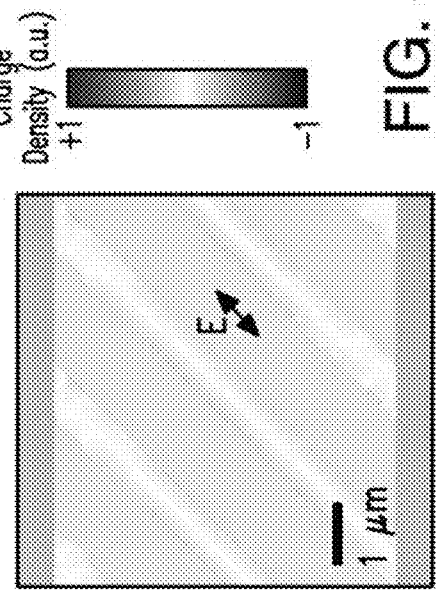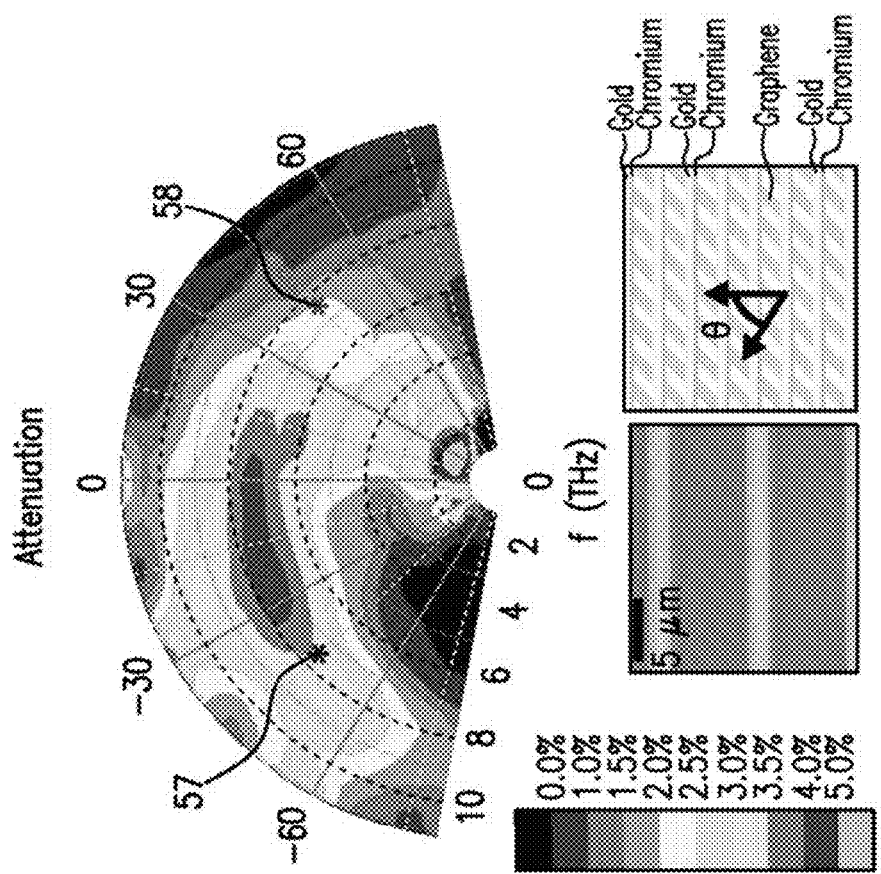
FIG. 4A
FIG. 4B
FIG. 4C

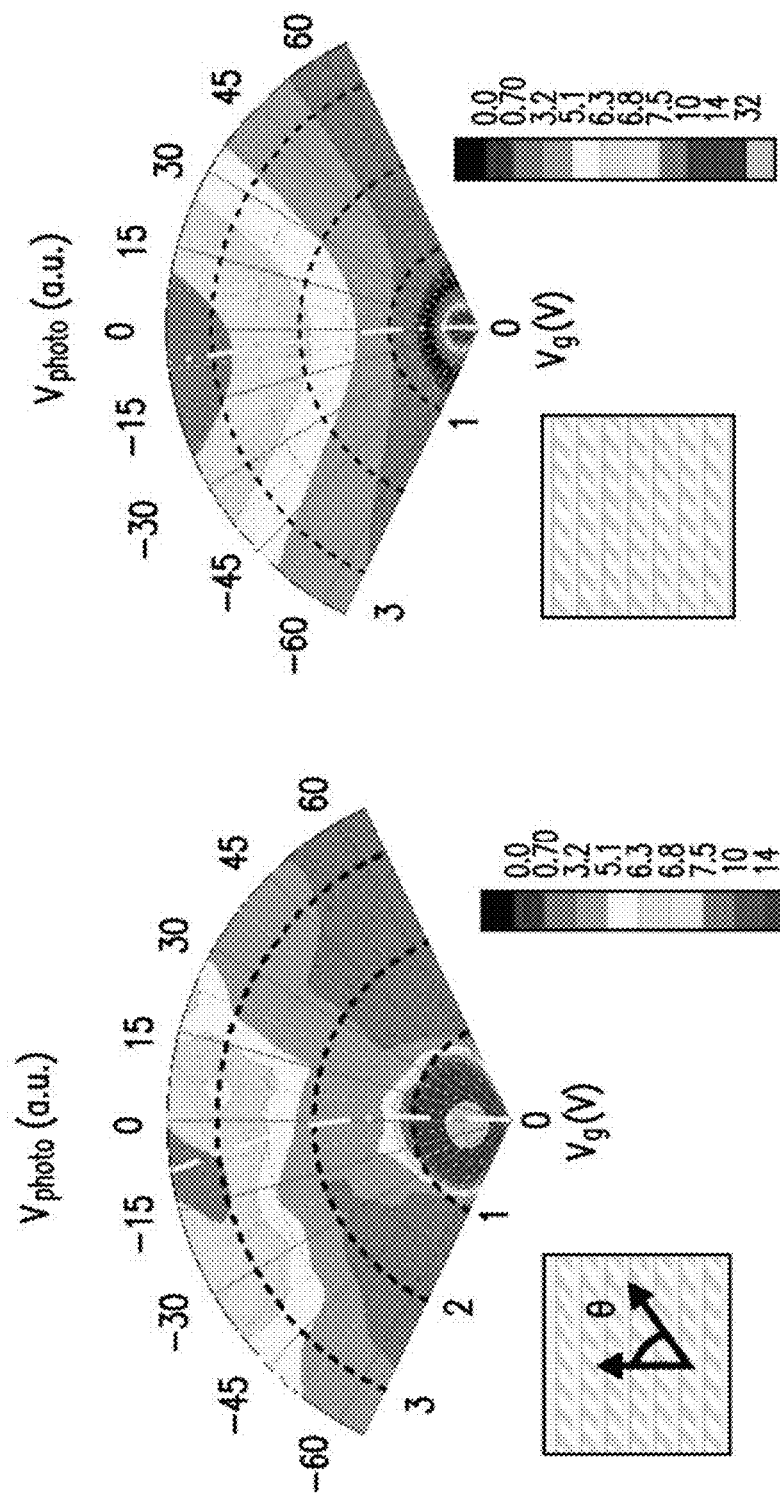

PLASMON-ENHANCED TERAHERTZ GRAPHENE-BASED PHOTODETECTOR AND METHOD OF FABRICATION

STATEMENT REGARDING FEDERAL SPONSORED RESEARCH OR DEVELOPMENT

This invention was made with government support under N000141310865 awarded by the Office of Naval Research (ONR). The government has certain rights in the invention.

REFERENCE TO THE RELATED APPLICATIONS

This Utility Patent Application is a National Stage Application of PCT/US2016/020213 filed on 1 Mar. 2016 and is based on a Provisional Patent Application No. 62/126,939 filed on 2 Mar. 2015.

FIELD OF THE INVENTION

The present invention is directed to photodetectors; and in particular to graphene-based large area terahertz photodetectors with an increased absorption efficiency.

More in particular, the present invention is directed to photodetectors with improved operational parameters attained through utilizing a tunable plasmonic resonance in sub-wavelengths graphene micro-ribbons formed on a SiC (0001) substrate.

In addition, the present invention is directed to graphene-based terahertz photodetectors formed with sub-wavelength graphene micro-ribbons patterned on a substrate, where the orientation of the graphene micro-ribbons is tailored with respect to an array of sub-wavelengths bi-metallic electrodes to enhance the plasmonic excitation by an incident light wave polarized perpendicular to the graphene micro-ribbons, and to attain maximized transmission when the incident light is polarized perpendicularly to the bi-metallic electrodes.

The present invention also is directed to graphene-based terahertz detectors exhibiting a strong absorption, and having a fast response, which are tunable over a broad range of frequencies in the THz (terahertz) spectrum by changing the dimensions of graphene micro-ribbons and/or the carrier density, and which are amenable to fabrication of arrays for large-area detectors.

In addition, the present invention is directed to graphene-based photothermo-electric detectors with an increased external efficiency attained by enhancing a resonant plasmon absorption tunable through geometric parameters of the structure and control of carrier density to enhance the absorption of radiation by graphene.

BACKGROUND OF THE INVENTION

Graphene has unique optoelectronic properties that result in a variety of potential photonic applications, such as optical modulators, plasmonic devices and terahertz (THz) emitters. Particularly promising is terahertz (THz) photodetection, in which graphene-based devices may offer significant advantages over existing technology in terms of speed and sensitivity.

Due to graphene's low electronic heat capacity and relatively large electron-electron relaxation rate compared to its electron-phonon relaxation rate, hot electron effects are prominent in graphene even at room temperatures. The hot electron effects have been exploited to attain fast and sensitive THz detection via the photothermoelectric effect and bolometric effect.

However a significant challenge remains in increasing graphene's absorption. Graphene's interband absorption is determined through a frequency-independent constant $\pi\alpha \approx 2.3\%$, where $\alpha$ is the fine structure constant. Owing to its zero band gap nature, doped graphene shows a relatively high DC conductivity, resulting in a considerable Drude absorption (free carrier response) in the THz range. However, the Drude absorption in graphene is strongly frequency dependent, decreasing as $(\omega\tau)^{-2}$ at high frequencies $\omega \gg 1/\tau$, where $\tau$ is the scattering time, proportional to graphene's mobility, and typically ranges between 10 fs and 100 fs in graphene. Thus, the Drude absorption rolls off at lower frequencies in higher mobility (higher $\tau$) graphene samples.

A number of efforts have been made to increase the absorption in graphene photodetectors.

For example, quantum dots have been deposited on graphene to enhance the light-matter interaction. However, this approach is limited to the visible or near infrared (where the interband absorption of the quantum dot lies), and the response times are unacceptably slow.

Another approach contemplates placing of the detector in a microcavity, which resonates at a selected frequency. This approach can enhance absorption, but to date this has been demonstrated only at near-infrared wavelengths, and can be cumbersome for long wavelength THz radiation.

Coupling the detector to an antenna is a viable approach for frequencies up to the low THz, but there are few demonstrations of antenna-coupled graphene devices, and the approach is applicable only to devices whose size is much smaller than the wavelength.

It is therefore desirable to overcome the deficiency of the prior approaches in pursuit to achieve a strong absorption and attain improved operational parameters in graphene-based detectors, specifically, through enhanced plasmon resonances in finite-width graphene.

SUMMARY OF THE INVENTION

It is an object of the present invention to provide a room temperature THz photo-detector built as a large area array of epitaxial graphene micro-ribbons disposed in contact with an array of bi-metal electrodes, where the responsivity of the photo-detector is significantly improved by the plasmon enhanced absorption.

It is another object of the present invention to provide a terahertz graphene-based photo-detector in which graphene micro-ribbons are disposed at a predetermined angle with respect to an electrode array, and in which the plasmon mode associated with currents transverse to the graphene micro-ribbons is efficiently excited by a lightwave polarized perpendicular to the graphene micro-ribbons.

In addition, it is an object of the present invention to provide a photothermoelectric detector built with an array of graphene micro-ribbons tilted at a predetermined angle relative to bi-metallic electrodes forming the electrode array, where an enhanced photovoltage at room temperature is attained when the carriers density of graphene is tuned to match the plasmon resonance frequency to the THz continuous-wave excitation, and where maximized transmission through the bi-metallic electrodes is attained by polarizing the incident light perpendicularly to them.

It is an additional object of the present invention to provide a graphene-based photodetector, in which the frequency and polarization-angle dependent absorption, as well as the gate voltage and polarization-angle dependent photoresponse, are well described by plasmonic conductivity model for graphene.

It is also an object of the present invention to provide a graphene-based terahertz photodetector with an increased absorption efficiency, high responsivity, and operational tenability of operational parameters over a broad range of frequencies in THz spectrum, and suitable for fabrication of arrays of large-area devices.

In one aspect, the present invention is related to a plasmon-enhanced terahertz graphene-based photodetector which comprises:

a micro-ribbon array formed on a substrate, and an array of electrode lines formed in electrical contact with the micro-ribbon array. The substrate may be made from SiC (0001) material.

The micro-ribbon array includes a plurality of graphene micro-ribbons of a predetermined width and length extending in spaced apart relationship one with respect to another.

The electrode lines of the electrode array extend in spaced apart relationship one with the other. The micro-ribbons are sandwiched between the array of the electrode lines and the substrate, and extend in an angled relationship (other than 90 degrees) to the electrode lines.

An electrolyte layer is positioned atop and in enveloping relationship with the micro-ribbon array and the array of electrode lines.

A source terminal and a drain terminal are coupled, respectively, to two outermost electrode lines in the structure, and a gate terminal is coupled to the electrolyte layer. A source of a gate voltage is coupled between the source and gate terminals.

The operational scheme of the subject photo-detector further includes a source of polarized light incident on the micro-ribbon array and the electrode array. The incident light may be polarized perpendicular to the electrode lines to achieve maximized transmission through them. In addition, the component of the incident light polarized perpendicular to the graphene micro-ribbons enhances the plasmon excitation in graphene.

Upon application of the gate voltage of a predetermined value Vg, the polarized light excites transverse plasmon resonance in the graphene micro-ribbons, thus increasing light absorption, and producing a plasmon-enhanced photodetection signal at the drain terminal. The Vg relative to graphene's charge neutrality point may be as high as 6.5 V, and below.

The graphene micro-ribbons extend substantially in parallel each to the other with a spacing not exceeding 2 μm. The width of each graphene micro-ribbon may range from 0.6 μm to 1.1 μm. The length of each graphene micro-ribbon between two metallic electrodes is approximately 7.3 μm or less.

The angled relationship between the graphene micro-ribbons and the electrode lines may be determined by an angle of approximately 45° therebetween.

Each of the electrode lines is formed by at least two layers formed by different metals, including, for example, a first-layer formed from chromium (Cr) and a second layer formed from gold (Au), extending in contact each to the other along the length of each electrode line. The electrode lines have a width from 1 μm to 2 μm, and extend substantially in parallel one with respect to another with the spacing therebetween not exceeding 0.6 μm-7.3 μm.

The thickness of the layer of Au may be approximately 25 nm, and the thickness of the layer of Cr may be approximately 20 nm.

In another aspect, the present invention is directed to a method of fabrication of a plasmon-enhanced terahertz graphene-based photodetector, which is accomplished through the sequence of the following steps:

(a) forming, on a surface of a SiC substrate, an array of graphene micro-ribbons extending substantially in parallel each to the other, (b) patterning, above the array of graphene micro-ribbons, an array of bi-metallic electrode lines extending at an angle of approximately 45° relative to the graphene micro-ribbons, (c) forming source and drain terminals at the outermost bi-metallic electrode lines of the array thereof, (d) forming a gate terminal, (e) applying a layer of an electrolyte atop the array of bi-metallic electrode lines to envelope the array of micro-ribbons and the array of bi-metallic electrode lines, said layer of electrolyte being coupled to the gate terminal, and (f) coupling a source of gate voltage between the source and gate terminals.

In the subject method, the graphene micro-ribbons may be formed by electron beam lithography followed by oxygen plasma treatment, and the bi-metallic electrode lines may be formed by a tilted-angle shadow evaporation technique.

The electrolyte may be $LiClO_4$:PEO having the ratio of 0.12:1.

The photodetector is exposed to an incident light polarized in perpendicular to the graphene micro-ribbons, to excite transverse plasmon resonance, and/or perpendicular to the electrode lines to obtain the maximized transmission.

The gate voltage is increased to approximately 6.5 V or below relative to graphene's charge neutrality point, and the photo response is read at the drain terminal.

These and other objects of the present invention will become apparent when considered in view of further description accompanying the Patent Drawings.

BRIEF DESCRIPTION OF THE DRAWINGS

FIGS. 2A-2I' are representative of the sequence of manufacturing steps for fabrication of the subject graphene-based photodetector;

FIG. 4A is a representation of a map of the polarization-dependent attenuation of the subject tilted array at $V_g=V_{g,\,min}+5.4$ V as a function of the frequency (radial axis) and the incident polarization (azimuthal axis);

FIGS. 4B and 4C are representations of the simulated charge density profile in the graphene/metal microstructure at the plasmon resonance frequency, where the polarization of the incident plane-wave (7.4 THz) is perpendicular to the graphene ribbons (in FIG. 4B) and parallel to the graphene ribbons (in FIG. 4C) corresponding to the points marked with asterisks in FIG. 4A, respectively;

FIG. 7A is a diagram representative of the measured magnitude of the photovoltage for the subject tilted graphene ribbon array photodetector (shown in FIG. 6A) as a function of $V_g$ (radial axis) and the incident polarization (azimuthal axis), with the frequency of the laser excitation of 5.3 THz (175 cm$^{-1}$);

FIG. 7B is a diagram of the simulated photoresponse of the subject device using the plasmonic conducting model;

DETAILED DESCRIPTION OF THE PREFERRED EMBODIMENTS

Figure 1:
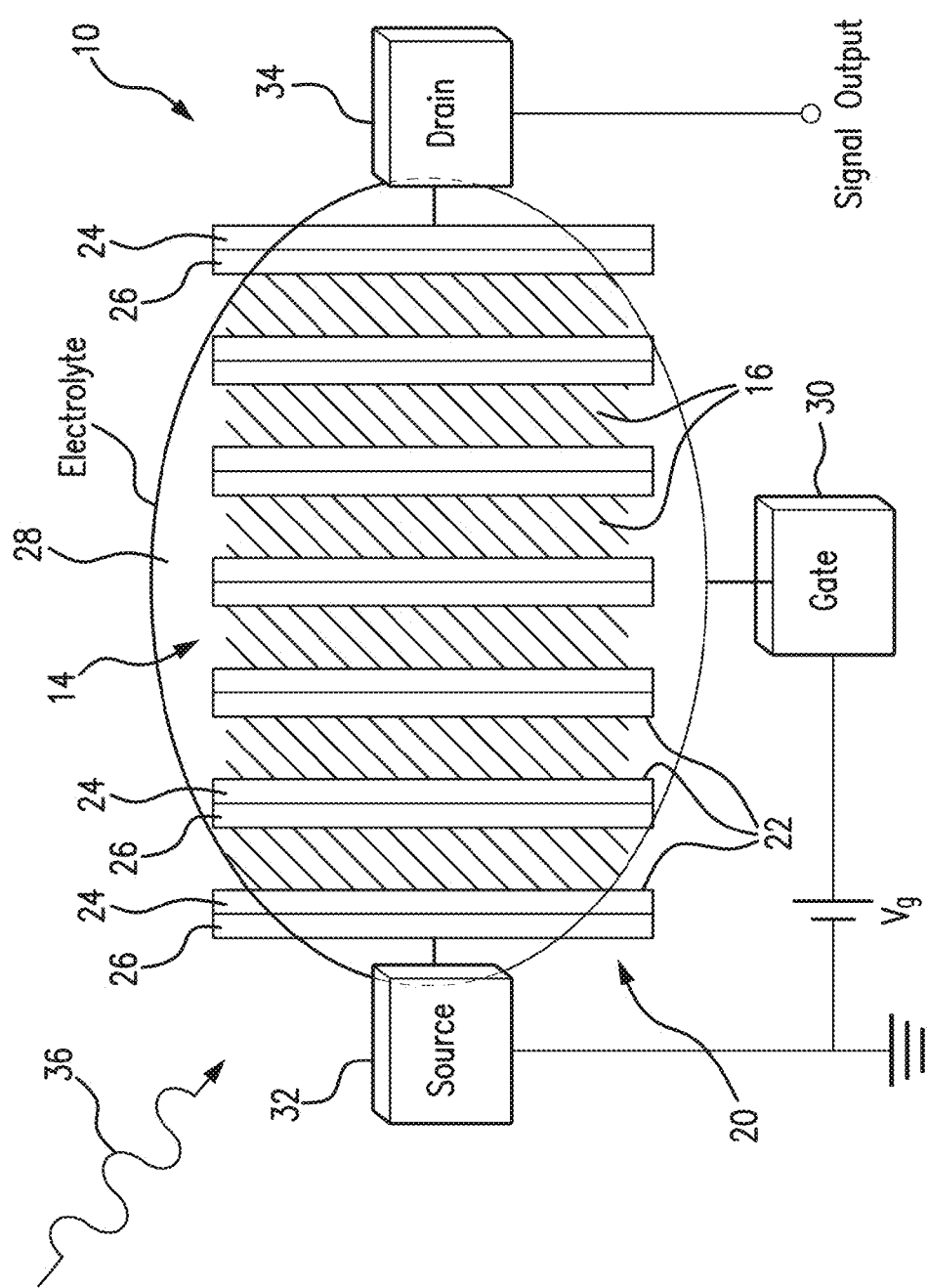
FIG. 1 is a schematic representation of the subject graphene-based photodetector.

Referring to FIG. 1, the graphene-based plasmon-enhanced terahertz (THz) photodetector 10 is formed on a substrate (not shown in FIG. 1) and includes a micro-ribbon array 14 which is formed with micro-ribbons (also referred to herein intermittently as ribbons or stripes) 16, and a metal electrodes array 20 which includes metal electrodes (also referred to herein as electrode lines) 22 formed with the width ranging, for example, from 1 μm to 2 μm. The micro-ribbons 16 extend on the top surface of the substrate at a predetermined distance defined between the ribbons 16. Preferably, the electrodes 22 are bi-metal electrodes which have a layer 24 of a first metal, for example chromium (Cr) of the thickness of approximately 20 nm, and a layer 26 of a second metal, for example, gold (Au) of the thickness of approximately 25 nm.

As an example, the length of the graphene stripes 16 between two bi-metal electrodes 22 may be approximately 7.3 μm or shorter. The width of each micro-ribbon 16 may, for example, range from 0.6 μm to 1.1 μm, with the spacing therebeween not exceeding 2 μm.

The spacing between electrodes 22 does not exceed the free space wavelength of a light incident on the surface of the structure 10 (as will be detailed in the following paragraphs), and may range, for example, from approximately 0.6 μm to approximately 7.3 μm.

The micro-ribbons 16 in the micro-ribbon array 14 extend in angled relationship with the electrodes 22 of the metal electrodes array 20 at a predetermined angle which may be, for example, 45 degrees.

The entire structure is covered with a layer of electrolyte 28.

The outermost electrodes 22 form the Source terminal 32 and Drain terminal 34, respectively, as shown in FIG. 1. A Gate terminal 30 is coupled to the metal electrodes array 20 via the electrolyte 28. A gate voltage Vg is applied between the Source terminal 32 and the Gate terminal 30, and the output signal is obtained at the Drain terminal 34.

When an incident light 36, preferably in the terahertz spectrum, is incident on the device 10, electrons in graphene micro-ribbons 16 are heated by the incident light, and the metal contacts 26 and 24 serve as a heat sink, resulting in a non-uniform electron temperature T (x) as a function of position x within the device. Because the electrodes 22 are formed with different metal contacts 26 and 24, the Fermi energy profile, and therefore the Seebeck coefficient, are asymmetric across the device. Defusion of hot electrons through the graphene micro-ribbons creates a potential gradient.

The total signal obtained at the Drain terminal 34 is an integral of the potential gradient over the device length and is non-zero due to the assymetry generated by conducting graphene micro-ribbons 16 with dissimilar metals (for example, Cr and Au) using a double-angle operation technique detailed in further paragraphs. An additional assymetry contributing in operation of the subject system is created by tilted relative disposition between the graphene micro-ribbons and bi-metallic electrodes.

FIGS. 2A-2I', illustrate the sequence of manufacturing steps for fabrication of the subject photodetector.

As shown in FIG. 2A, 200 nm thick layer 40 of PMMA [poly(methy methacrylate), produced by Micro Chem Corp.] photoresist is coated on the top of the chip 42 which is fabricated with a layer 44 of graphene on the substrate 46.

The starting material for the graphene layer 44 is an epitaxial single-layer graphene (detailed in L. O. Nyakiti, et al., MRS Bulletin, 2012, 37, (12), 1149-1157) on the (0001) semi-insulating (resistivity >10$^9$ Ω-cm) 6H—SiC substrate 46.

As shown in FIG. 2B the PMMA layer 40 is etched down to the graphene layer 44 to form a mask 48 for the subsequent graphene etching. As shown in FIG. 2B, exposed graphene areas 50 are formed between the PMMA mask areas 48.

Subsequently, as shown in FIG. 2C, oxygen plasma treatment is applied to the structure of FIG. 2B to remove the exposed graphene 50, and the 2-dimensional layer 44 of graphene is patterned into a micro-ribbon array using electron beam lithography with the PPMA mask 48.

In the following step, shown in FIG. 2D, the remaining PMMA mask 48 is removed, and the array 14 of graphene micro-ribbons 16 is formed on the surface of the substrate 46.

FIG. 2D' is a top view of the structure shown in FIG. 2D illustrating the graphene micro-ribbon array 14 formed on the SiC substrate 46. The micro-ribbons 16 extend substantially in parallel each to the other with a distance 18 left therebetween in a predetermined direction defined by the E-beam lithographical technique.

Subsequently, chromium/gold electrode array 20 of bi-metal electrodes 22 is thermally evaporated on the micro-ribbon array 14. As shown in FIG. 2E, for formation of the bi-metalic electrodes, the lift off mask 52 is covered on the chip. The mask 52 is a bi-layer photo-resist structure which is formed with a layer 54 of methyl methacrylate (8.5%)/methacrylic acid copolymer (MMA), produced by Micro Chem Corp., and a PMMA layer 56. FIG. 2E' shows a side view of FIG. 2E taken along the length of the graphene micro-ribbon 16.

Figure 2F:
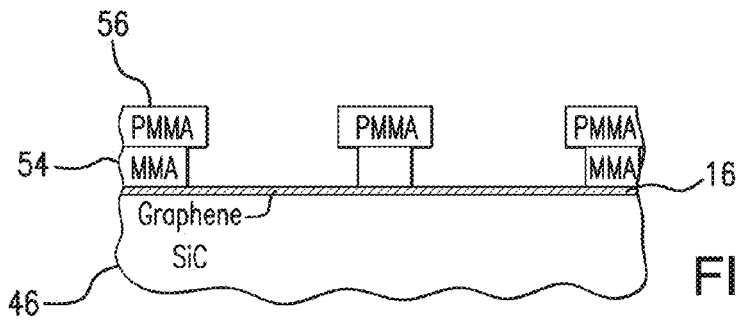

Subsequently, as shown in FIG. 2F, the lift off mask 52 is patterned using E-beam lithography.

Figure 2G:
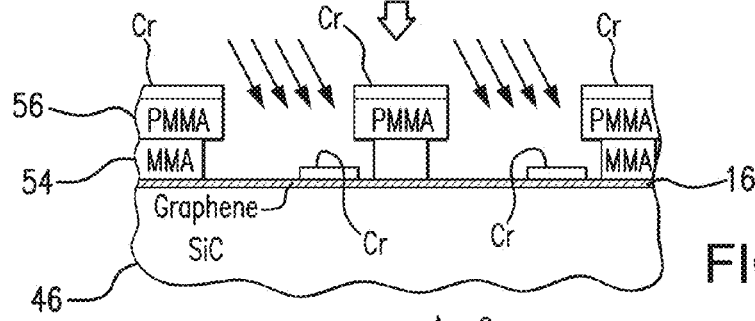
Figure 2H:
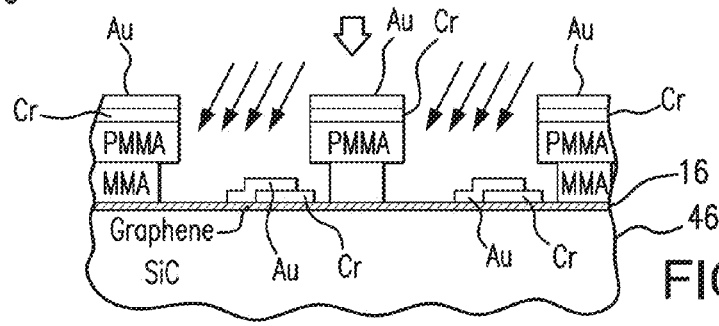
Figure 2I:
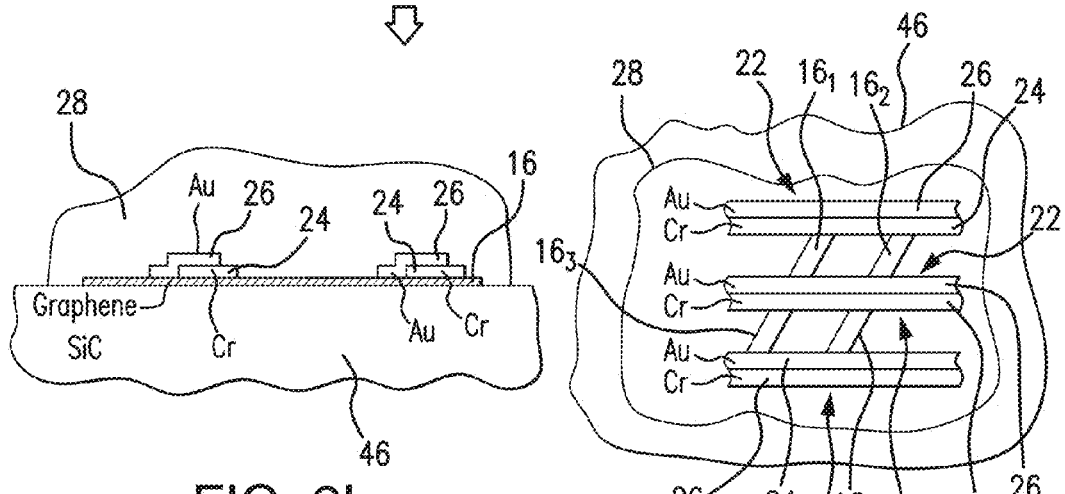

Subsequently, referring to FIGS. 2G and 2H, dissimilar metal contacts (Au and Cr) are fabricated in one lithographic step using a tilted-angle shadow evaporation technique (J. Niemeyer, et al., *Appl. Phys. Lett.*, 1976, 29, (6), 380-382). As shown in FIGS. 2G and 2H, 20 nm chromium layer (FIG. 2G) and 25 nm gold layer (FIG. 2H) are deposited at different evaporation angles, thus forming an array of the bi-metal electrodes 22 in contact with the graphene micro-ribbons 16. FIGS. 2I and 2I' show, respectively, a side view and a top view of the subject structure where the micro-ribbons 16 are tilted a predetermined angle relative to the electrodes 22.

As a final step, a droplet of electrolyte 28 [LiClO$_4$:PEO (Polyethylene Oxide)=0.12:1] is used to cover the device 10, thus forming the electric scheme of the subject photo-detector adapted for applying gate voltages.

In the resulting device 10, each graphene strip (micro-ribbon) 16 forms a light sensitive unit, which generates photovoltage, when illuminated by the light-wave (for example, laser radiation). Thus, each micro-ribbon 16 can be regarded as a nano-battery.

Graphene stripes 16 connected in series (such as, for example, micro-ribbons 16$_1$ and 16$_3$, as well as 16$_2$ and 16$_4$, shown in FIGS. 2I') in the device 10, are used to add up the photovoltage. The graphene micro-ribbons 16$_1$ and 16$_2$, and 16$_3$ and 16$_4$ are connected in parallel, and thus contribute in reduction of the resistance of the entire device 10 to attenuate the noise.

The plasmon dispersion relation for graphene (L. Ju, et al., *Nat. Nano-technol.*, 2011, 6, (10), 630-634; E. H. Hwang, et al., *Phys. Rev. B*, 2007, 75, (20), 205418; F. Rana, *IEEE Trans. on Nanotechnol.*, 2008, 7, (1), 91-99) can be expressed as:

$$q = \frac{\hbar(\varepsilon_1 + \varepsilon_2)}{4\pi^{1/2} e^2 v_F n^{1/2}} \omega(\omega + i/\tau) \quad \text{(Eq. 1)}$$

where $\varepsilon_{1,2}$ is the dielectric constant of the media above/below graphene, n is the charge carrier density in graphene, $v_F=10^6$ m/s is graphene's Fermi velocity, $\hbar$ is Planck's constant, and e the elementary charge.

A graphene ribbon 16 of width W determines the plasmon wavevector q as:

$$q = \frac{N\pi - \delta}{W} \quad \text{(Eq. 2)}$$

where N is the harmonic order of the plasmonic mode, and $\delta$ is a phase shift upon reflection at the graphene edge.

Numerical results indicate that $\delta=\pi/4$ for termination by dielectric (D. N. Basov, et al., *Rev. Mod. Phys.*, 2014, 86, (3), 959-994; A. Y. Nikitin, et al., *Phys. Rev. B*, 2014, 90, (4), 041407).

Then, for the plasmon resonance frequency:

$$\omega_p = \left(\frac{3\pi^{3/2} v_F e^2}{\hbar(\varepsilon_1 + \varepsilon_2)}\right)^{1/2} \frac{n^{1/4}}{W^{1/2}} \quad \text{(Eq. 3)}$$

For graphene on SiC substrates ($\varepsilon_1 \sim 9.6$) with PEO electrolyte top gate ($\varepsilon_2 \sim 3$), the plasmon frequency $f_p$ can be determined as:

$$f_p = \omega_p/2\pi = 2.73 \text{ THz} \times [n(10^{12} \text{ cm}^{-2})]^{1/4} \times [W(\mu m)]^{-1/2} \quad \text{(Eq. 4)}$$

The standing wave plasmons in monolayer epitaxial graphene on SiC (0001) substrates have been observed on the structures built with the large area graphene deposited on SiC substrate patterned into a micro-ribbon arrays using, for example, standard electron beam lithography.

Figure 3A:
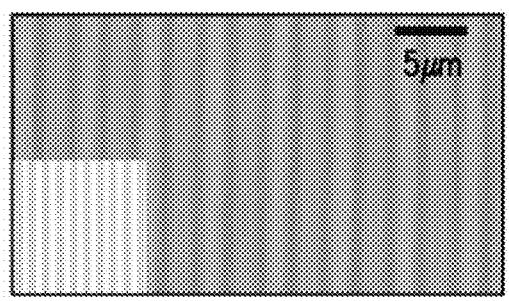
FIGS. 3A, 3D and 3G are schematic representations of optical micrographs of a graphene ribbon array without metal electrodes (FIG. 3A), a graphene ribbon array oriented orthogonal to a metal electrode grating (FIG. 3D), and a subject graphene ribbon array tilted 45 degrees with respect to a metal electrode grating (FIG. 3G), respectively.

FIG. 3A shows the optical micrograph of a sample with patterned electron-beam photoresist, which was used as a mask for etching graphene into an array of parallel stripes. In FIG. 3A, the total array size is 2 mm×2 mm, the stripe width is 2.3 μm, and the period of the array is 4.6 μm.

The photo-response of the device shown in FIG. 3A to the THz excitation was characterized by Fourier Transform Infrared spectroscopy (FTIR). The measured attenuation spectra with the excitation E polarized parallel and perpendicular to the ribbons are plotted in FIGS. 3B and 3C, respectively.

The attenuation A is defined as:

$$A = 1 - \frac{T(V_g)}{T(V_{g,min})} = \Delta T/T(V_{g,min}), \quad \text{(Eq. 5)}$$

where $T(V_g)$ is the transmission when the applied gate voltage is $V_g$, and $T(V_{g, min})$ is the transmission at the charge neutral point. The carrier density n in graphene was tuned by applying the gate voltage $V_g$ through an electrolyte top gate as shown in FIG. 1.

Figure 3B:
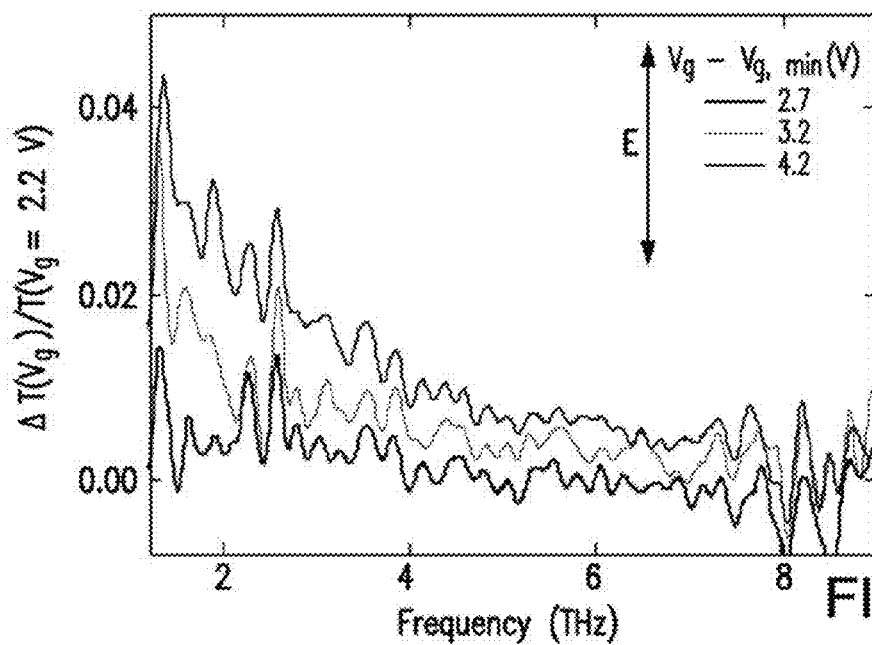
FIGS. 3B-3C are diagrams of the attenuation spectra at different gate voltages $V_g$ for the array shown in FIG. 3A, where in FIG. 3B, the incident electric field is polarized parallel to graphene ribbons, and in FIG. 3C, the incident electric field is polarized in perpendicular to graphene ribbons.
Figure 3C:
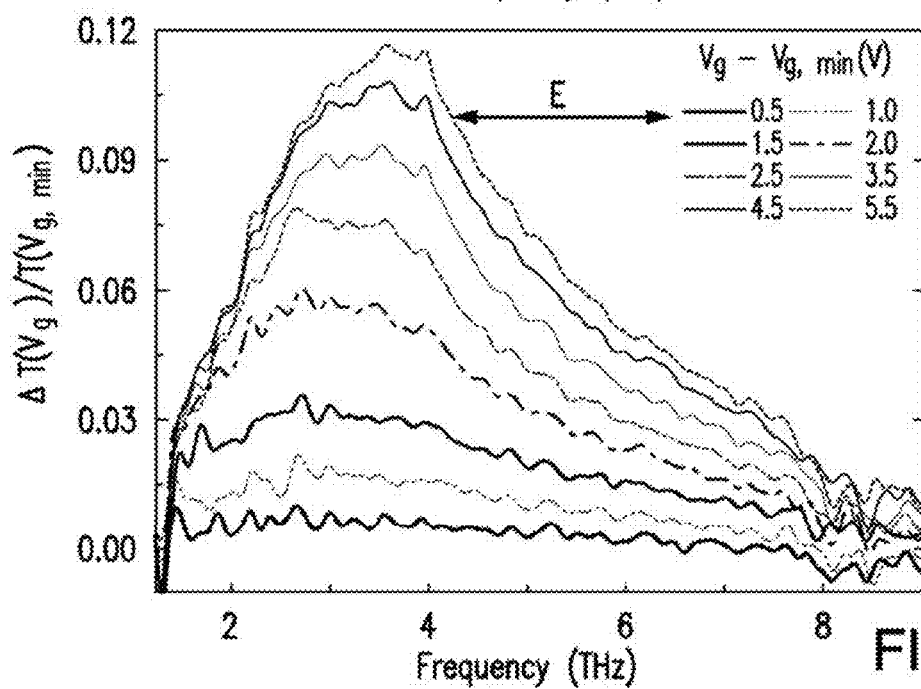

In FIG. 3C, the spectra are normalized to the transmission at $V_{g,min}$, and to the transmission at $V_g=V_{g,min}+2.2$ V (shown in FIG. 3B). The measured spectrum corresponds to the lowest carrier density of graphene achieved in each data set, as the reference spectrum was measured for normalization.

As shown in FIG. 3B, a Drude response was observed, with the attenuation decreased monotonically with the frequency.

A completely different lineshape was observed for the attenuation spectra in FIG. 3C, when the incident light was polarized perpendicular to the graphene ribbons. In this case an enhanced absorption was seen which was associated with excitation of the intrinsic plasmon.

In the device shown in FIG. 3A, where the ribbon width is fixed, a blue shift of $f_p$ was observed when the charge carrier density n in graphene was increased by raising the gate voltage. The spectra shown in FIG. 3C was modeled using a simple plasmonic conductivity model, with plasmon frequency $f_p$ and the charge carrier density n as fit parameters, and assuming a mobility of graphene $\mu=1300$ cm$^2 \cdot$V$^{-1} \cdot$s$^{-1}$.

The modeled $f_p$ vs. n was subsequently plotted with a fit to Eq. (3), which results in $$f_p=1.92 \text{ THz}\times[n(10^{12}\text{ cm}^{-2})]^{1/4} \qquad \text{(Eq. 6)}$$

The prefactor 1.92 is very close to the expected value of 1.80 found from Eq. (3) with the ribbon width W=2.3 μm. FIG. 3I shows the individual fits to curves selected from FIG. 3C.

It is expected that detectors exploiting hot electron effects will require electrode spacings comparable to the diffusion length of electrons (less than 1 μm) due to electron-phonon scattering, far smaller than the THz wavelength in free space (~100 μm) (Q. Ma, et al., *Phys. Rev. Lett.*, 2014, 112, (24), 247401).

Figure 3D:
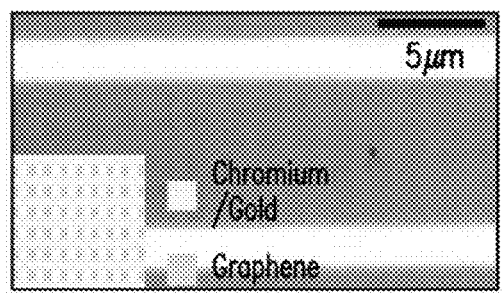

FIG. 3D shows a graphene micro-ribbon array, similar to that shown in FIG. 3A but contacted by an array of metal electrodes extending in perpendicular to the micro-ribbons. The vertical graphene ribbons are 0.6 μm wide with a period of 2 μm. The horizontal chromium/gold (with the thickness of 4 nm/45 nm) electrodes were patterned on top of the graphene ribbons with an electrode width 1.7 μm and period of 9 μm.

Figure 3E:
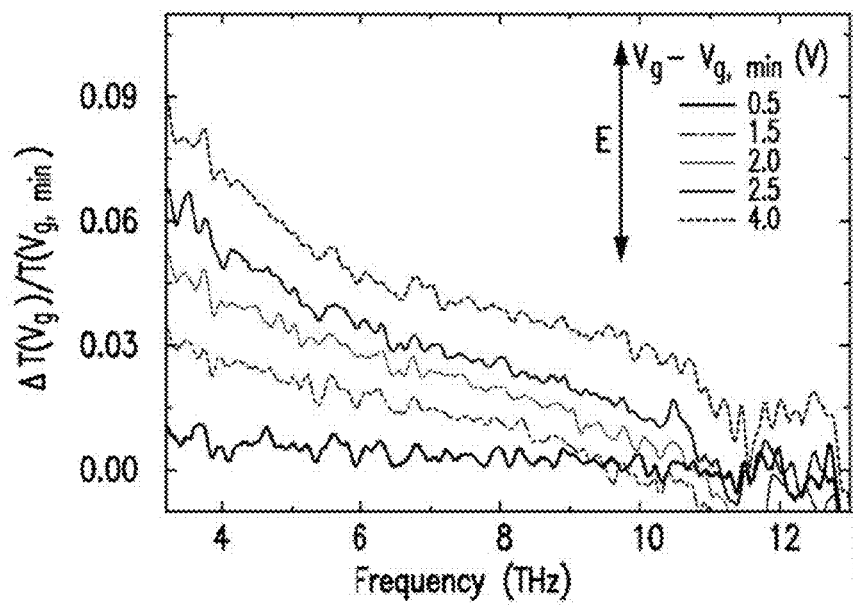
FIGS. 3E-3F are diagrams of the attenuation spectra normalized by the spectrum at $V_g = V_{g,\ min}$, for the array shown in FIG. 3D, where in FIG. 3E, the incident electric field is polarized parallel to the graphene ribbons, and in FIG. 3F, the incident electric field is polarized in perpendicular to the graphene ribbons.
Figure 3F:
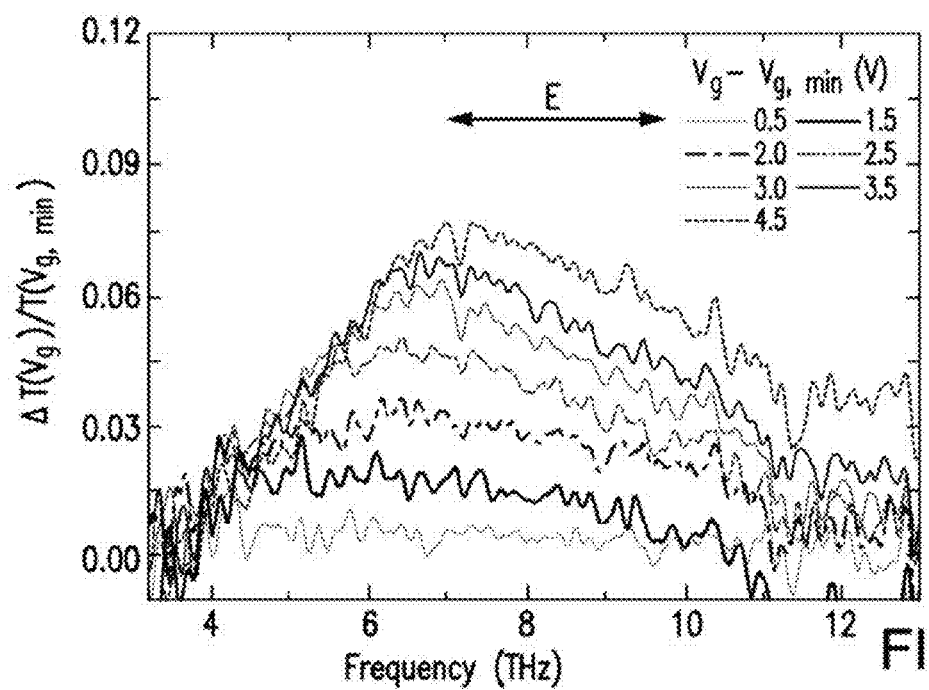

FIGS. 3E and 3F show the measured attenuation spectra for two polarization cases. When the incident terahertz signal was polarized in parallel to the micro-ribbons, a Drude-like response was produced which is shown in FIG. 3E. For polarization perpendicular to the ribbons, a plasmon resonance was observed which is shown in FIG. 3F.

Comparing FIGS. 3C and 3F, it is found that the strength of the plasmon resonance is reduced in the metal-contacted case structure shown in FIG. 3D, and is smaller than the strength of the resonance for the uncontacted ribbons (shown in FIG. 3A). This is a consequence of the effect of the sub-wavelength metal grating that is a good reflector for radiation polarized parallel to the grating wires. The extinction coefficient of metal wire gratings scales in proportion to $(d/\lambda)^2$ at long wavelengths. This is a significant disadvantage of the structure shown in FIG. 3D, since detectors will require smaller electrode spacing on the micron scale limited by the diffusion length.

Figure 3G:
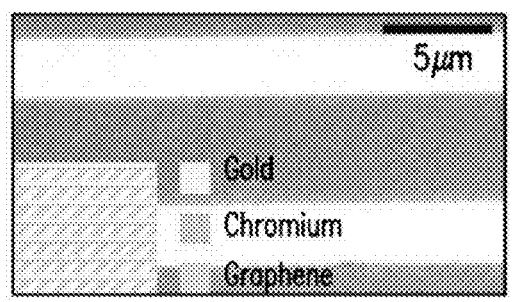

To overcome the shortcomings of the arrays shown in FIGS. 3A and 3D, the subject array shown in FIG. 3G (as well as in FIGS. 1 and 2I') has been built with graphene ribbons tilted at an angle with respect to the metal grating. In this device, the period of the graphene ribbon array is 2 μm and the ribbon width is 0.6 μm, similar to the device shown in FIG. 3D.

Bi-metal electrodes (20 nm chromium+25 nm gold) are deposited on graphene ribbons using, for example, a two-step shadow evaporation technique. The graphene ribbons are inclined at an angle of approximately 45 degrees with respect to the metal contacts, and have a length of 5.7 μm, which is shorter than in the array shown in FIG. 3D, but still reasonably long, in order to allow some transmission of both parallel and perpendicular polarizations.

Figure 3H:
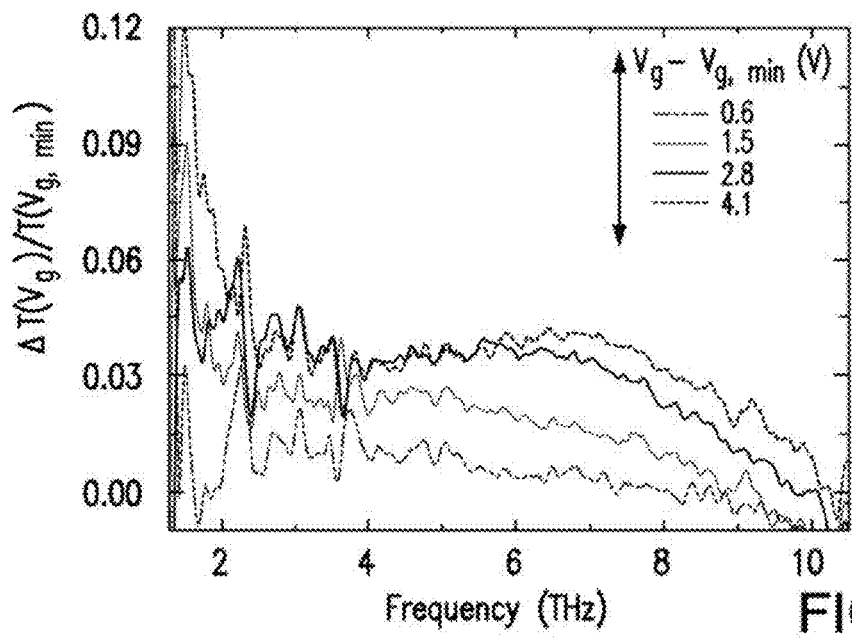
FIG. 3H is a diagram of the attenuation spectra for the array shown in FIG. 3G with the incident electric field polarization at 45° to the graphene ribbons, and perpendicular to the metal grating.
Figure 3I:
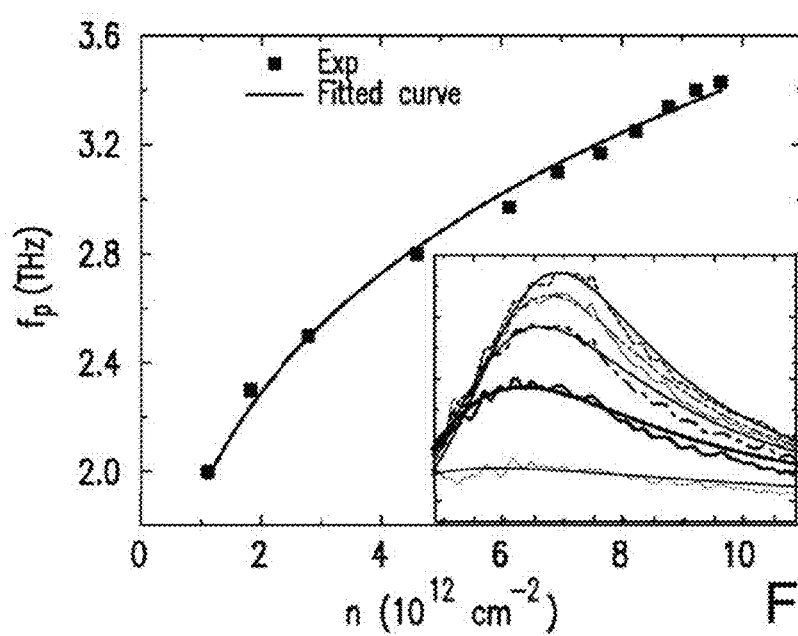
FIG. 3I is a diagram of the Plasmonic resonance frequency $f_p$ as a function of carrier density n for the array shown in FIG. 3A.

Light polarized perpendicular to the metal grid (which does not suffer from the polarizer effect) has an electric field component perpendicular to the graphene ribbon axis and can therefore excite the transverse plasmon resonance. In this case, when the incident terahertz radiation is polarized perpendicular to the metallic grating, the evidence of gate-tunable plasmonic absorption in the attenuation spectrum may be seen, as shown in FIG. 3H. This is in contrast to FIG. 3E, where no plasmonic resonance can be seen for light polarized perpendicular to the metal electrode grating.

The polarization dependence of the tilted-ribbon array has been explored. FIG. 4A shows a map of the polarization-dependent attenuation of the tilted ribbon array shown in FIGS. 1, 2I', and 3G, at $V_g = V_{g,\,min} + 5.4$ V. The highest gate voltage (highest carrier density) relative to graphene's charge neutrality point achieved in the experiments was approximately 6.5 V. The scale shown in FIG. 4A indicates the normalized attenuation.

By applying a gate voltage, graphene's carrier density (and thus its electrical conductivity) can be tuned. Graphene's charge neutrality point (which is typically used as a reference point) corresponds to an applied gate voltage, where graphene shows a minimum conductivity (smallest doping).

Also, a scanning electron micrograph of the device under study with the graphene ribbons tilted 45° to the metal electrodes and the schematic of the device with the defined polarized angle θ of the incident light, are shown in FIG. 4A.

Considering the metal polarizer effect, the attenuation in this example is defined as $$A=(1-T_{high}/T_{low})\cdot f(\omega,\theta), \qquad \text{(Eq. 7)}$$

where $T_{high}$ is the transmission at $V_g=V_{g,\,min}+5.4$ V, $T_{low}$ is the transmission at $V_g=V_{g,\,min}$, and $f(\omega,\theta)$ is the experimentally determined extinction factor of the metal grating (detailed in further paragraphs).

In FIG. 4A, the attenuation is plotted as a function of frequency (plotted along the radial direction) and polarization angle θ, as defined in the inset schematic. Because the attenuation is multiplied by $f(\omega,\theta)$, the effect of the metal grating is included, and the polarization dependence is due to both the attenuation caused by graphene and metal grid.

Additionally, the metal grid is symmetric with respect to polarizations at positive and negative angles ±θ, so the asymmetry for ±θ is caused by the tilting of graphene with respect to the metal grid. A highly asymmetric pattern of attenuation has been observed.

When the angle θ of polarization was inclined in the direction parallel to the graphene ribbons (θ>0), a Drude-like absorption spectrum was observed, which decreased monotonically with frequency. By contrast, when the angle of polarization was inclined in the direction perpendicular to the ribbons (θ<0), a peak in attenuation at ~7.4 THz was observed, which can be identified as the plasmon resonance frequency for the ribbons at this gate voltage.

FIGS. 4B and 4C show the simulated charge density oscillations in the subject device structure at this frequency for two polarization angles θ=±45° (perpendicular and parallel to the ribbons, marked with asterisks 57 and 58 in FIG. 4A), respectively.

Compared to FIG. 4C, which shows a very weak charge density oscillation, FIG. 4B clearly displays a charge density wave excited by the incident electric field polarized perpendicular to the ribbons, which supports the identification of the observed attenuation peak at 7.4 THz and θ<0 as the transverse plasmon in the subject graphene-metal microstructure.

A device, similar to that shown in FIG. 4A, but with a smaller electrode spacing and more compatible with enhanced photothermoelectric detection has been fabricated using the same manufacturing steps as for the device shown in FIG. 4A, but the graphene ribbon width was 1.1 μm (and even narrower, such as, for example, 0.6 μm-1.1 μm) and the inter-electrode spacing is 3.8 μm, which is closer to the estimated graphene hot carrier diffusion length in order to enhance the hot electron photothermoelectric effect and thus to improve the detection efficiency. Ideally, an even shorter spacing could be adopted, in order to make the subject device more dominated by diffusive cooling and putting more light sensitive elements in series to enhance the photovoltage signal.

The two-step shadow evaporation technique for asymmetric metal electrodes deposition may be used, so that each graphene channel (light sensitive part of the detector) has asymmetrical contacts (for example, a gold contact on the bottom and a chromium contact on the top of the electrodes 22), which helps to generate a net photothermoelectric signal when the device is uniformly illuminated.

Figure 5A:
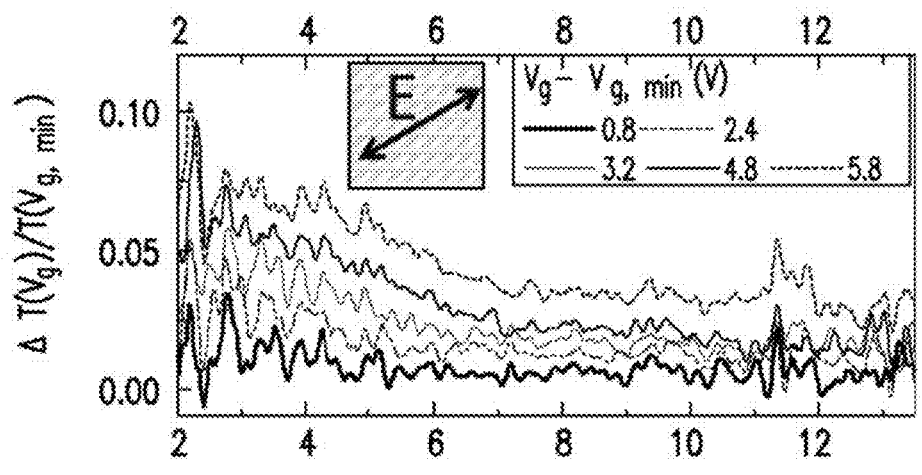
FIGS. 5A-5C are the diagrams representative of the attenuation at different $V_g$ normalized by the spectrum at $V_{g,\,min}$ as a function of frequency for the subject device with graphene ribbon width is 1.1 μm and the inter-electrode spacing of 3.8 μm, where in FIG. 5A, the incident polarization angle θ=60°, corresponding to a Drude response, in FIG. 5C, the incident polarization angle θ=−60°, corresponding to a plasmon response, and in FIG. 5B, the incident polarization angle θ=0°, corresponding to a combined Drude and plasmon response. The insets in each diagram of FIGS. 5A-5C show schematics of the device and the polarization E of the incident light for each measurement, respectively.
Figure 5B:
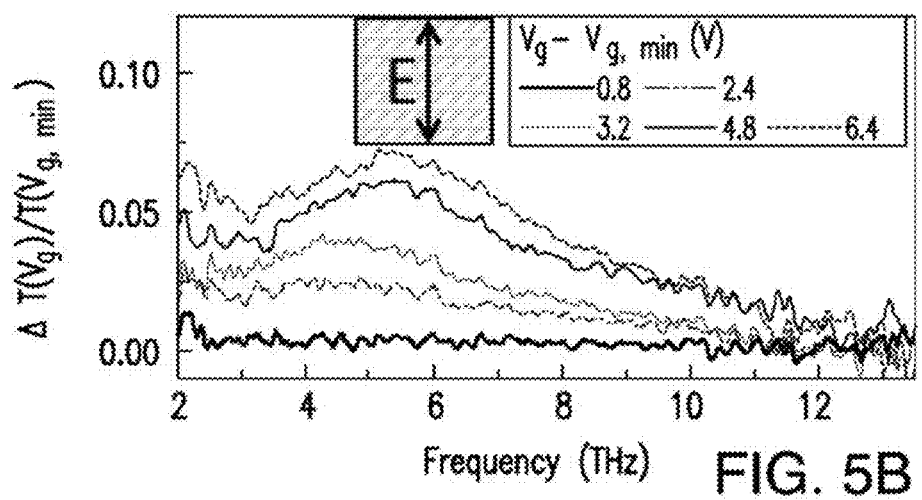
Figure 5C:
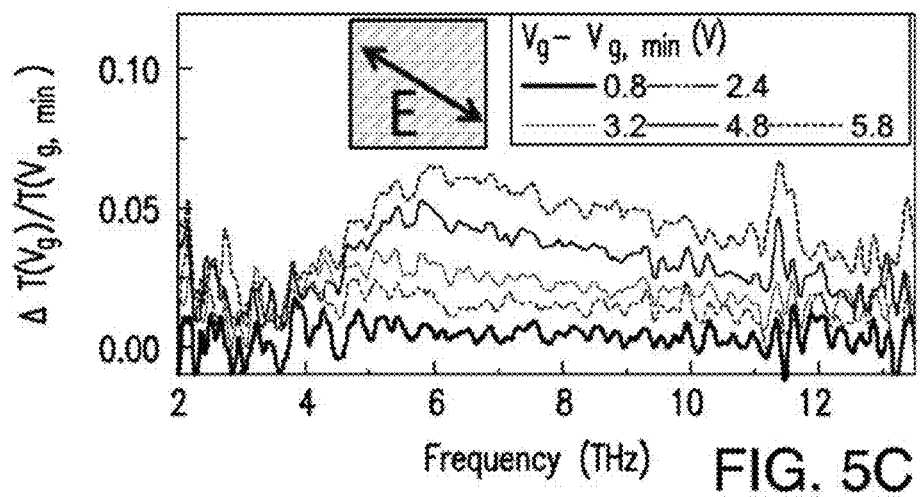

FIGS. 5A-5C show the attenuation spectra at different gate voltages for the incident light polarized with three typical polarization angles.

At θ=60° (FIG. 5A) due to the polarizing effect of the metal grid (which reduces the parallel component of the electric field), the effective electric field interacting with graphene is nearly parallel to the ribbons, resulting in a dominant Drude response.

At θ=−60° (FIG. 5C), the effective electric field is close to perpendicular to the graphene ribbons, which excites the transverse plasmons in the graphene ribbon, leading to an increased attenuation at the plasmon resonant frequency which is exhibited in the range 4-6 THz. As expected, the plasmon frequency increases with charge carrier density which is varied by applying a gate voltage.

A combined response is observed, especially at high gate voltage, at θ=0° (FIG. 5B), the angle at which the incident light is minimally absorbed by the metal grid. In this case, the components of the electric field parallel and perpendicular to graphene ribbons are nearly equal. At the highest gate voltage (the curve corresponding to the gate voltage of 5.8 V), the attenuation shows a local plasmonic peak at f~5.3 THz and also a Drude response at a low frequency.

The frequency and the polarization angle dependence of the attenuation at large positive gate voltage has been studied in more detail. FIG. 6A shows the attenuation of the subject device behaving as shown in FIGS. 5A-5C at $V_g = V_{g, min}+6.5$ V (6.5V relative to graphene's charge neutrality point), which is the highest gate voltage (carrier density) achieved.

Similar to FIG. 4A, in FIG. 6A, the scale indicates the normalized attenuation. As shown in FIG. 6A, the attenuation peaks near θ=0°, since the metal grating reflects a large portion of the incident light polarized in other directions owing to the small spacing between metal electrodes. There is a local maximum at the frequency of ~5.3 THz corresponding to plasmon-enhanced attenuation, which is clearly separated from the Drude response at f<3 THz. The plasmon peak is asymmetric in polarization angle with more weight at negative angle, while the Drude response occurs at positive angle.

To understand the relationship between plasmonic excitation and polarization, a plasmon conductivity model has been developed to predict the expected absorption in the graphene ribbons. The modeled attenuation is plotted in FIG. 6B in the same way as the data shown in FIG. 6A. The only free parameters of the model are the carrier density $n=1.6\times10^{13}$ cm$^{-2}$ and the mobility of graphene $\mu=800$ cm$^2$V$^{-1}$ s$^{-1}$ which determines τ=37 fs.

According to the model, the resistivity of the device at this gate voltage is ~500Ω, which is lower than the measured resistivity 1.4 KΩ. This difference has been attributed to the contact resistance contribution, in the two-probe transport measurement across multiple graphene/metal junctions. The model reproduces the features of the experimental data. A stronger attenuation peak at finite frequency is both predicted and observed when the angle of polarization is inclined towards the direction perpendicular to the graphene ribbons, which signifies the excitation of a transverse plasmonic resonance.

Photoresponse measurements were performed using a continuous wave THz laser at 5.3 THz as the source of the radiation. FIGS. 7A-7B show the photovoltage as a function of the applied top gate voltage (radial axis, measured relative to the charge neutral point) and the polarization angle of the CW excitation (azimuth).

The photovoltage is generated in graphene by the photothermoelectric effect (M. Freitag, et al., *Nat. Photonics*, 2013, 7, (1), 53-59; N. M. Gabor, et al., *Science*, 2011, 334, (6056), 648-652; J. C. W. Song, et al., *Nano Lett.*, 2011, 11, (11), 4688-4692) due to asymmetry of the electrodes. As reported in X. Cai, et al. (*Nat. Nanotechnol.*, 2014, 9, (10), 814-819), this type of asymmetry leads to photothermoelectric voltage that is peaked near the Dirac point and monotonically decreases with the carrier density in a highly doped sample.

Figure 6B:
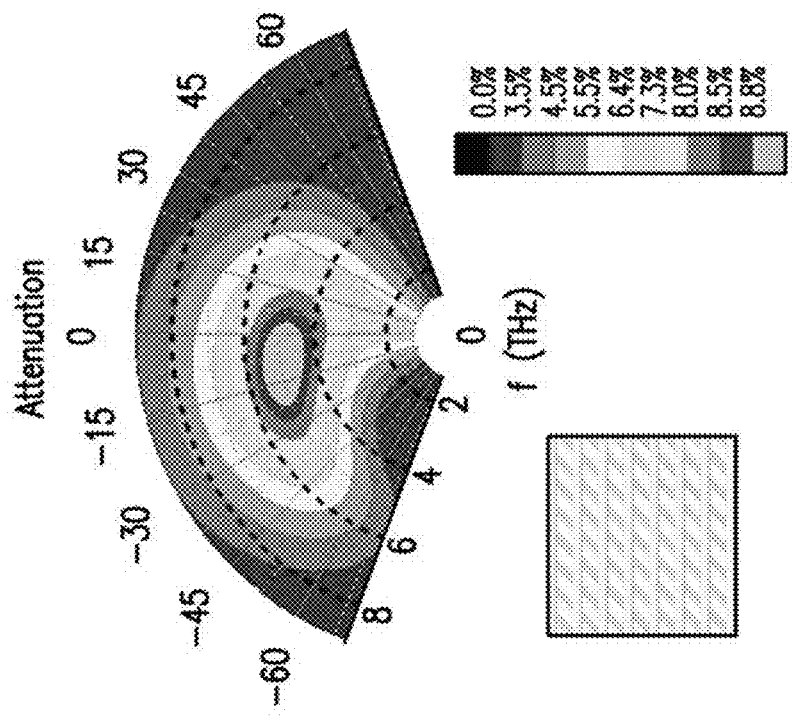
FIG. 6B is a diagram of the simulated attenuation of the subject device using the plasmonic conducting model. The insets in FIGS. 6A-6B show schematics of the subject devices and define the polarization angle θ.
Figure 6A:
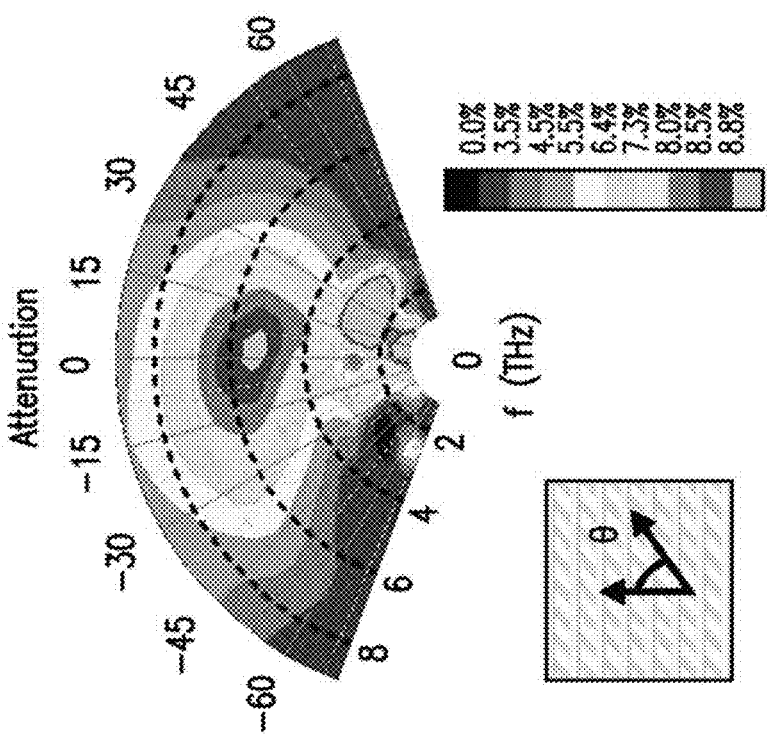
FIG. 6A is a diagram of the experimental attenuation at $V_g=V_{g,\,min}+6.5$ V as a function of frequency (radial axis) and the incident polarization (azimuthal axis) for the subject device.

FIG. 7B shows the modeled photoresponse as a function of the gate voltage and the polarization angle, using the same parameters as in FIG. 6B, and a photothermoelectric model (described in X. Cai, et al., *Nat. Nanotechnol.*, 2014, 9, (10), 814-819), with an asymmetry generated by both an extra contact resistance $R_c=35Ω$ at the gold electrode and the difference of the work function between chromium and gold.

Both the experimental and modeled signals exhibit the maxima at small gate voltages where the photothermoelectric responsivity peaks (P. Wei, et al., *Phys. Rev. Lett.*, 2009, 102, (16), 166808; Y. M. Zuev, et al., *Physical Review Letters*, 2009, 102, (9), 096807).

In addition, when the gate voltage is low, the photovoltage is symmetric around θ=0° as the plasmon is only weakly excited in the low doped region. The signal for the subject device with a small metal spacing depends primarily on the polarizer effect of the metal electrodes and thus peaks with angle near θ=0°.

At larger gate voltages, the photoresponse increases with increasing gate voltage. This rise is not due to increased responsivity. As observed in X. Cai, et al., *Nat. Nanotechnol.*, 2014, 9, (10), 814-819, and explained within the asymmetric metal electrodes model, the responsivity decreases monotonically at high gate voltage with increasing gate voltage. Instead, the increase is explained by enhanced absorption in the device, which is due to:

(1) increase in DC conductivity with increased gate voltage, and (2) resonant plasmonic absorption.

The shift of the peak in photoresponse with respect to the angle θ<0°, clearly indicates that the plasmonic effect is dominant in increasing the absorption, similar to FIGS. 6A and 6B.

Summarizing the aforesaid, the subject device has demonstrated efficient THz excitation of resonant plasmons in graphene micro-ribbon arrays contacted by metal electrodes with spacing much smaller than the free space wavelength. Resonant plasmon absorption enhances the absorption of radiation by graphene, and therefore increases the external efficiency of graphene photothermoelectric detectors.

Additionally the plasmon resonance is tunable through both geometry (ribbon width) and carrier density, enabling spectral resolution and tunability in graphene photothermoelectric detectors.

In the subject device, the spectral resolution quality factor $Q=\omega_p\tau=1.2$ is limited by the fairly low mobility of epitaxial graphene. Hence for the present device the THz attenuation is comparable in magnitude for the Drude and plasmonic absorption, as seen in FIGS. 5A-5C.

The subject scheme has significant advantages if the mobility of the graphene can be increased, thus increasing the scattering time τ which determines the width of both the Drude response and plasmon resonance, achieving a high quality factor $Q=\omega_p\tau$ and large separation between Drude and plasmon responses.

In addition, since the DC conductivity of graphene is expressed as $\sigma=ne\mu$, high mobility graphene would enable a strong plasmon resonance peak (which is proportional to the DC conductivity of the graphene sheet) at low doping, where the thermoelectric response is maximized.

Single-element graphene photothermoelectric detectors based on Drude absorption (X. Cai, et al., *Nat. Nanotechnol.*, 2014, 9, (10), 814-819) have already shown an unprecedented combination of responsivity, NEP (Noise Equivalent Power), and speed in the THz detection. The subject scheme provides a route forward (as higher mobility is achieved in a higher quality graphene) to detectors with higher efficiency (due to higher plasmonic absorption) and better spectral sensitivity (due to narrower plasmon resonance).

Figure 8:
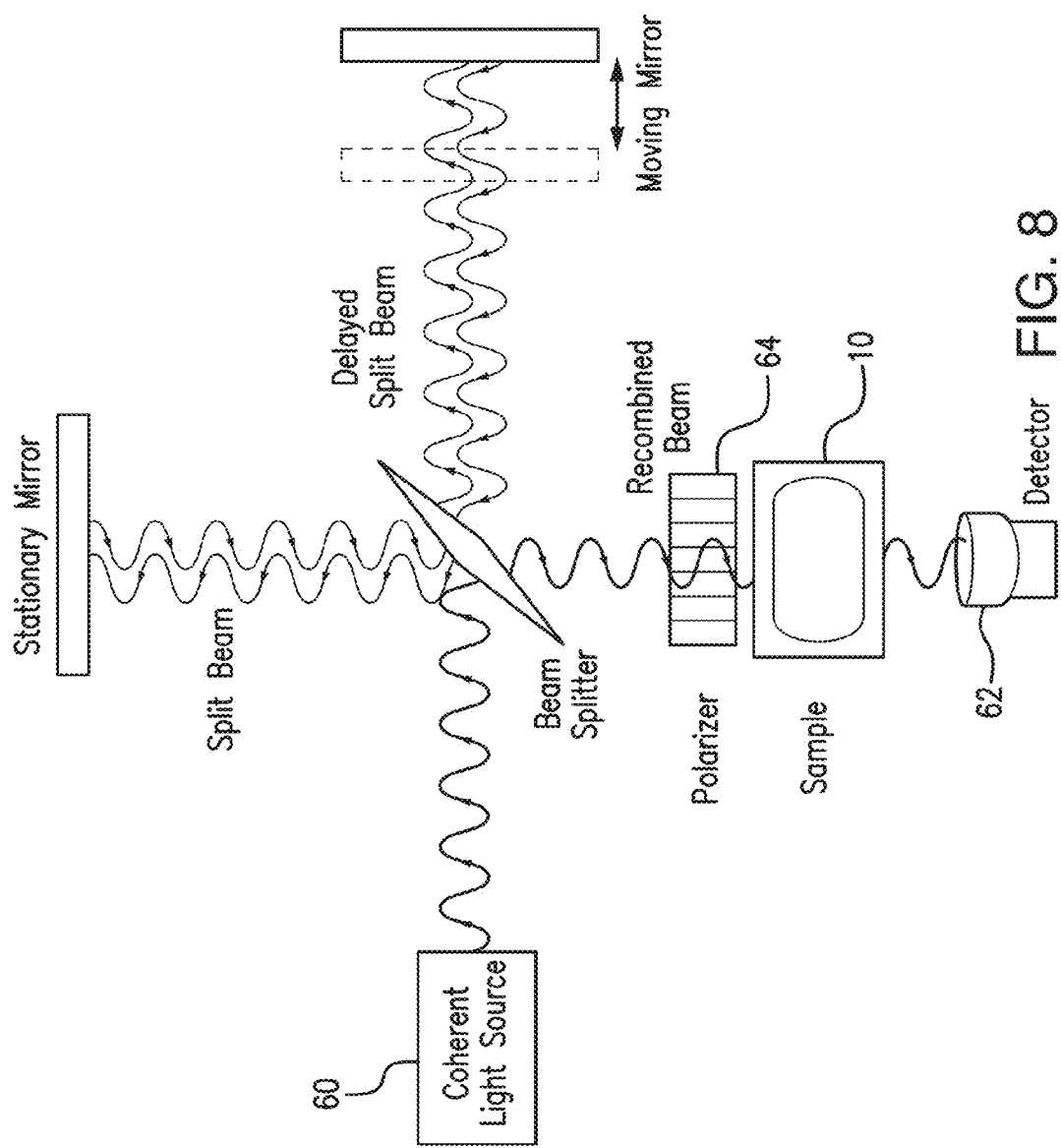
FIG. 8 is a schematic representation of the FTIR experimental setup.

Far infrared transmission measurements were performed in a BOMEM DA-8 FTIR system shown in FIG. 8 with a mercury lamp 60 as a source and 4 K silicon composite bolometer 62 as a detector. The 2×2 mm² device 10 was mounted on a copper plate with a 2 mm diameter aperture. The mounted sample 10 was placed in vacuum at room temperature and was uniformly illuminated by the incident beam of 8 mm in diameter.

The sample aperture was strongly overfill to minimize spectrometer diffraction losses at low frequencies. An electronically controlled rotating wire grid polarizer 64 was placed in front of the sample. To minimize time drift of the signal, the transmitted spectrum was consecutively measured through the device and an identical bare aperture placed in the sample position at each gate value and their ratio resulted in the absolute transmission.

Subsequently, all transmission spectra was divided by the transmission spectrum measured at the Dirac point. Model calculations mimic the experimental procedure.

Figure 9:
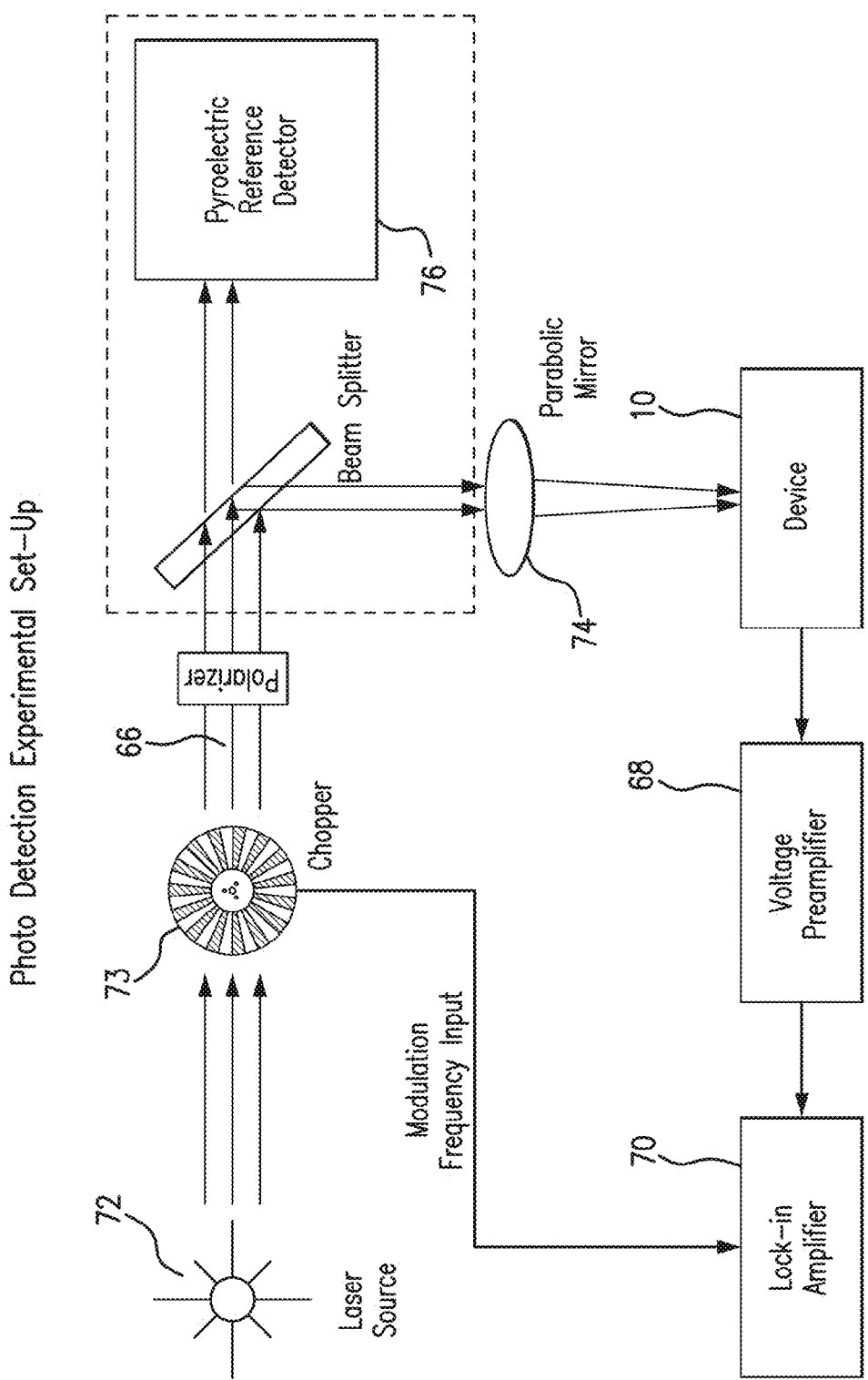
FIG. 9 is a schematic representation of the experimental setup for measuring the photoresponse of the subject device to THz excitation.

As shown in FIG. 9, the THz photoresponse was characterized by illuminating the device 10 with a chopped continuous wave laser beam 66 and detecting the open-circuit photovoltage signal using a voltage preamplifier 68 and lock-in amplifier 70.

The THz laser 72 was optically pumped by $CO_2$-laser resonator with Methanol-D ($CH_3OD$) vapors generating a line at 5.3 THz (175 cm$^{-1}$) frequency. The sample was mounted on the same copper plate as in the FTIR measurements (shown in FIG. 8), and the beam illuminated the device through the SiC substrate to avoid the absorption by the electrolyte. A chopper 73 was used to modulate the frequency of the incident light, followed by a rotating polarizer which was placed in front of the focusing parabolic mirror (D=F=50 mm) 74.

The photovoltage was continuously normalized by the signal of the pyroelectric reference detector 76.

The sample 10 was mounted on an x-y-z scanning stage together with another pyro-detector, which was used for the power calibration (including signal for rotating polarizer). Charge density oscillation at plasmon resonance frequency was obtained using a finite element method frequency-domain simulation.

Plane-wave excitation (7.4 THz) was simulated with a polarization parallel and perpendicular to graphene micro-ribbons. The geometrical parameters of the element were the same as for the real device described in the previous paragraphs. The carrier density of graphene was approximately 2×10$^{13}$ cm$^{-2}$. The mobility was approximately 5000 cm$^2$·V$^{-1}$·s$^{-1}$, which is possibly higher than that of the real device, in order to illustrate the plasmon mode more clearly.

To model the relative attenuation through the device at different gate voltages, the transmission of the graphene ribbons was initially calculated using the thin-film expression (S. Wu, et al. *Phys. Rev. B*, 1996, 54, (18), 13343-13347)

$$T = \frac{4n_1 n_2}{|n_1 + n_2 + Z_0\sigma|^2} \tag{Eq. 8}$$

where $n_1=1.73$ and $n_2=3.1$ are the refractive index of the electrolyte and SiC substrate, respectively, $Z_0=377\Omega$ is the impedance of free space, and σ is AC conductivity of graphene.

The AC conductivity σ can be written as $$\sigma_d=\sigma_0/(1+i\omega\tau) \text{ for Drude response} \tag{Eq. 9}$$

and $$\sigma_p=\sigma_0/(1+i(\omega^2-\omega_p^2)\tau/\omega) \text{ for plasmon excitation} \tag{Eq. 10}$$

where $\sigma_0$ is the DC conductivity, ω is the frequency, τ is the electron scattering time, and $\omega_p$ is the plasmon resonance frequency.

Both $\sigma_0$ and τ can be expressed as a function of the carrier density n and mobility μ of graphene, written as $$\sigma_0=ne\mu \text{ and } \tau=\sqrt{\pi n\hbar}\mu/ev_F \tag{Eq. 11}$$

where e is elementary charge and $v_F$ is the Fermi velocity.

The relative attenuation is then expressed as $$\Delta T = 1 - \frac{T(V_g)}{T(V_{g,min})} \tag{Eq. 12}$$

To fit the attenuation spectra shown in FIG. 3C, a fixed $\mu=1300$ cm$^{-2}$·V$^{-1}$·s$^{-1}$ was estimated, and n and $\omega_p$ were set as fitting parameters. To plot the polarization-dependent attenuation through the device shown in FIGS. 4A and 6A, the effective average electric field seen by graphene was first calculated, which was estimated as an electric field of the incident beam corrected by the extinction factor $\sqrt{f(\omega,\theta)}$ of the metal grating.

The $f(\omega,\theta)$ is defined as $$f(\omega,\theta)=\cos^2(\theta)+\sin^2(\theta)\cdot\Phi(\omega) \tag{Eq. 13}$$

where $\Phi(\omega)\in[0,1]$ is the ratio of the measured transmission at θ=90° and 0°, when the device is at the charge neutral point.

The polarization-dependent attenuation can be then described as $$\Delta T = \left[1 - \frac{T_{high}}{T_{low}}\right]\cdot f(\omega,\theta) \tag{Eq. 14}$$

where $T_{high}$ and $T_{low}$ contribute to the measured transmission in highly and low (charge neutral point) doped graphene.

When modeling the spectra, the effective electric fields, i.e., the electric field of the incident light corrected by the factor f(ω,θ) was projected to the axes parallel and perpendicular to graphene ribbons. The parallel and perpendicular components contribute to a Drude and plasmonic absorption, respectively.

Considering the perturbation of metal electrodes, it was assumed that the plasmon mode does not extend over the full length of the strip (micro-ribbon). It was estimated that it covers ~80% of the area of the strip.

The transmission of the graphene ribbons was described by the same thin-film expression as explained in previous paragraphs. In the subject device, μ is estimated to be 800 cm$^2 \cdot$V$^{-1} \cdot$s$^{-1}$ and n is 1.6×10$^{13}$ cm$^{-2}$. The standing wave plasmon frequency ω$_p$ is given by Eq. (3).

The photoresponse was calculated based on a photothermoelectric model (X. Cai, et al., *Nat. Nanotechnol.*, 2014, 9, (10), 814-819). The electron temperature rise of each graphene ribbon element from the absorbed THz radiation was determined by the thermal conductance.

Since metal contacts remain at room temperature, a temperature profile across the graphene ribbon is generated. The thermoelectric voltage was calculated as (P. Wei, et al., *Phys. Rev. Lett.*, 2009, 102, (16), 166808).

$$V = \int dx S \cdot \nabla T \quad \text{(Eq. 15)}$$

where ∇T is the electron temperature gradient and S(x) is the Seebeck coefficient of graphene.

The asymmetric metal contacts produce a net thermoelectric signal via:
(1) nonuniformity in S(x) across the device due to chemical potential pinning (B. Huard, et al., *Phys. Rev. B*, 2008, 78, (12), 121402) at the graphene/metal interface, and
(2) asymmetric temperature profile due to different contact resistance (X. Cai, et al., *Nat. Nanotechnol.*, 2014, 9, (10), 814-819; P. A. Khomyakov, et al., *Phys. Rev. B*, 2010, 82, (11), 115437).

Comparing the subject device with the device shown in X. Cai, et al., *Nat. Nanotechnol.*, 2014, 9, (10), 814-819, which is a bi-metal contacted exfoliated graphene on SiO$_2$ substrate, the same value has been assumed for metal work functions and different values have been assumed for the contact resistance. The observed photoresponse is best described by an additional contact resistance R$_c$=35Ω at the region extending 130 nm from the gold contact inside the graphene (the corresponding extra contact resistivity ρ$_c$=300 Ω), somewhat less than was found for exfoliated graphene devices on SiO$_2$ substrates.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of the elements may be reversed or interposed, all without departing from the spirit or scope of the invention as defined in the appended claims.

What is claimed is:

1. A plasmon-enhanced terahertz graphene-based photodetector, comprising:
   a substrate,
   a micro-ribbon array formed on said substrate, said micro-ribbon array including a plurality of graphene micro-ribbons of a predetermined width extending in a spaced apart relationship one with respect to another, and
   an array of electrode lines formed in electrical contact with said micro-ribbon array, said electrode lines extending in spaced apart relationship one with respect to another,
   wherein said micro-ribbons are sandwiched between said array of electrode lines and said substrate and extend in an angled relationship different than 90 degrees to said electrode lines.

2. The plasmon-enhanced terahertz graphene-based photodetector of claim 1, further including an electrolyte layer positioned atop and enveloping said micro-ribbon array and said array of electrode lines.

3. The plasmon-enhanced terahertz graphene-based photodetector of claim 2, further including a source terminal and a drain terminal coupled to two outermost electrical lines of said array of electrode lines,
   a gate terminal coupled to said electrolyte layer, and
   a source of gate voltage applied between said source and gate terminals.

4. The plasmon-enhanced terahertz graphene-based photodetector of claim 3, further including a source of a polarized light, wherein said polarized light is incident on said micro-ribbon array and said array of electrode lines and is polarized substantially in perpendicular to micro-sized elements selected from a group consisting of: said graphene micro-ribbons, said electrode lines, and combination thereof.

5. The plasmon-enhanced terahertz graphene-based photodetector of claim 4, wherein said electrode lines extend substantially in parallel one with respect to another with the spacing therebetween not exceeding the free space wavelength of said incident light, wherein the width of each of said electrode lines ranges from 1 μm to 2 μm, and said spacing therebetween ranges from 0.6 μm to 7.3 μm.

6. The plasmon-enhanced terahertz graphene-based photodetector of claim 3, wherein upon application of said gate voltage of a predetermined value Vg, said polarized light excites transverse plasmon resonance in said graphene micro-ribbons, thus increasing light absorption, and producing a plasmon-enhanced photodetection signal obtained at said drain terminal.

7. The plasmon-enhanced terahertz graphene-based photodetector of claim 6, wherein said Vg is approximately 6.5 V and below.

8. The plasmon-enhanced terahertz graphene-based photodetector of claim 1, wherein said substrate is made from SiC (0001) material.

9. The plasmon-enhanced terahertz graphene-based photodetector of claim 1, wherein the width of each said graphene micro-ribbons ranges from 0.6 μm to 1.1 μm.

10. The plasmon-enhanced terahertz graphene-based photodetector of claim 1, wherein said graphene micro-ribbons extend substantially in parallel each to the other with a spacing therebetween not exceeding 2 μm.

11. The plasmon-enhanced terahertz graphene-based photodetector of claim 1, wherein said angled relationship between said graphene micro-ribbons and said electrode lines is determined by an angle of approximately 45° therebetween.

12. The plasmon-enhanced terahertz graphene-based photodetector of claim 1, wherein the length of each of said graphene micro-ribbons does not exceed 7.3 μm.

13. The plasmon-enhanced terahertz graphene-based photodetector of claim 1, wherein each of said electrode lines are formed by at least two layers formed by different metals.

14. The plasmon-enhanced terahertz graphene-based photodetector of claim 13, wherein said at least two layers of each said electrode line include a first layer formed from chromium and a second layer formed from gold, extending in contact each with the other along the length of said each electrode line.

15. The plasmon-enhanced terahertz graphene-based photodetector of claim 14, wherein the thickness of said first layer of chromium is approximately 20 nm, and the thickness of said second layer of gold is approximately 25 nm.

16. The method of fabrication of a plasmon-enhanced terahertz graphene-based photodetector, comprising:
(a) patterning, on a surface of a SiC substrate, a single layer of graphene, thus forming an array of graphene micro-ribbons extending substantially in parallel each to the other,
(b) forming, in electrical contact with said array of graphene micro-ribbons, an array of bi-metallic electrode lines extending at an angle of approximately 45° relative to said graphene micro-ribbons,
(c) forming source and drain terminals at the outermost bi-metallic electrode lines of said array thereof,
(d) forming a gate terminal,
(e) applying a layer of electrolyte atop of said array of bi-metallic electrode lines to envelope and being in contact with said array of micro-ribbons and said array of bi-metallic electrode lines, said layer of electrolyte being coupled to the gate terminal, and
(f) coupling a source of gate voltage between said source and gate terminals.

17. The method of claim 16, wherein in said step (a), said graphene micro-ribbons are formed by electron beam lithography followed by oxygen plasma treatment, and
wherein in said step (b), said bi-metallic electrode lines are formed by tilted-angle shadow evaporation technique.

18. The method of claim 16, wherein said substrate is made of semi-insulating 6H—SiC material, and
said graphene micro-ribbons are patterned in an epitaxial single layer graphene.

19. The method of claim 16, wherein said electrolyte is $LiClO_4$:PEO having the ratio of 0.12:1.

20. The method of claim 16, further comprising:
exposing said photodetector to an incident light polarized in a direction perpendicular to microsized elements selected from a group consisting of: said graphene micro-ribbons, said bi-metallic electrode lines, and combination thereof, to excite transverse plasmon resonance,
increasing said gate voltage to approximately 6.5 V relative to graphene's charge neutrality point, and
obtaining the photo response at said drain terminal.

* * * * *